United States Patent [19]

Lehmann et al.

[11] Patent Number: 5,262,021
[45] Date of Patent: Nov. 16, 1993

[54] METHOD OF MANUFACTURING A PERFORATED WORKPIECE

[75] Inventors: Volker Lehmann, Munich; Hans Reisinger, Gruenwald, both of Fed. Rep. of Germany

[73] Assignee: Siemens Aktiengesellschaft, Munich, Fed. Rep. of Germany

[21] Appl. No.: 6,939

[22] Filed: Jan. 21, 1993

[30] Foreign Application Priority Data

Jan. 29, 1992 [DE] Fed. Rep. of Germany ....... 4202454

[51] Int. Cl.$^5$ ................................................. C25F 3/14
[52] U.S. Cl. ............................ 204/129.55; 204/129.65
[58] Field of Search ........................ 204/129.55, 129.65

[56] References Cited

U.S. PATENT DOCUMENTS 4,874,484 10/1989 Foell .............................. 204/129.55

*Primary Examiner*—T. M. Tufariello
*Attorney, Agent, or Firm*—Hill, Steadman & Simpson

[57] ABSTRACT

A method of forming holes extending perpendicular to a first surface of a workpiece comprises providing the substrate wafer of n-doped, single-crystal silicon, and then electrochemically etching the substrate wafer to form a structured layer having the desired perforations. The electrochemical etching particularly occurs in a fluoride-containing electrolyte, and the substrate wafer is connected as an electrode. If the process parameters are maintained, the electrochemical etching will produce holes having a constant, substantially uniform cross section. However, varying the process parameters can cause changes in the cross section of the hole adjacent a base of the hole so that it is possible to enlarge the hole to facilitate stripping the workpiece as a lamina from the substrate.

16 Claims, 1 Drawing Sheet

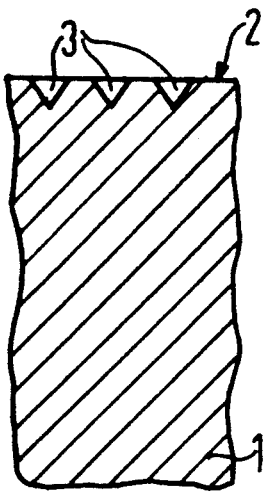
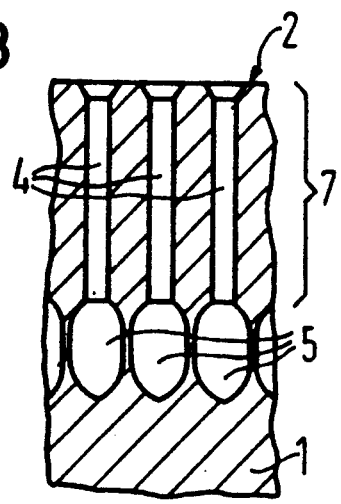
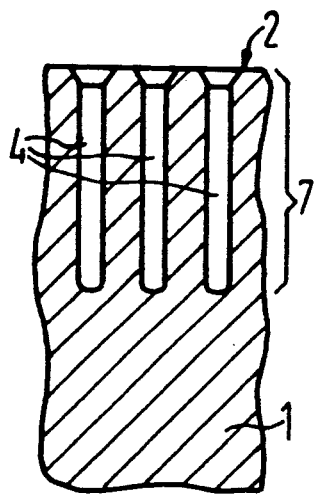
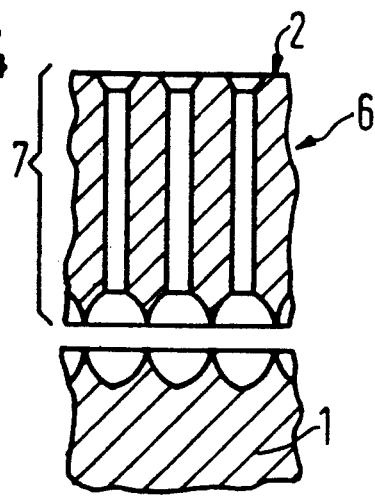
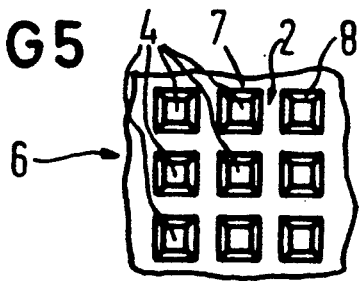

METHOD OF MANUFACTURING A PERFORATED WORKPIECE

BACKGROUND OF THE INVENTION

Perforated workpieces are required for many technical applications, particularly as economical optical or mechanical filters having pore diameters in the μm and sub-μm range. For example, such applications are isoporous membranes, back-rinsable filters, laminizers, catalyst carriers, electrodes for batteries and field cells, nozzle plates, tube gratings or filters for electromagnetic waves, such as, for example, light or microwaves.

A known method for manufacturing such filters is a so-called LIGA technique, wherein LIGA stands for Lithography, Galvanik (a German word for electroplating) and Abformung (a German word for shaping). In the LIGA technique which, for example, is known from E. W. Becker et al, *Microelectronic Engineering*, Vol. 4 (1986), pages 35ff, a thick photoresist layer is structured with the assistance of a synchrotron radiation. Subsequently, the structures are transferred into the filter by electroforming and shaping techniques with plastics. Minimum structural widths of 2 μm can be achieved with the LIGA technique. However, no structuring is possible in a dimension extending parallel to the throughput direction through the filter. The required employment of synchrotron radiation makes this method extremely expensive.

SUMMARY OF THE INVENTION

The present invention is, thus, based on the object of providing a method for manufacturing a perforated workpiece with which pore diameters in the μm and sub-μm range can be achieved and which method can be implemented in a simple manner.

To accomplish these objects, the method is for manufacturing a perforated workpiece having holes extending perpendicular to a first surface of a structured layer of the workpiece, which layer is of an n-doped, single-crystal silicon. The method comprises providing a substrate of n-doped, single-crystal silicon, said substrate having the first surface, then electrochemically etching the first surface of the substrate by connecting the substrate as an anode, contacting the first surface with an electrolyte, setting the current density to influence the etching erosion on the first surface, continuing the etching until the depths of the holes essentially correspond to a desired thickness of the finished workpiece and then modifying the processing parameters of the etching to cause a cross section of a base of each of the etch holes to be enlarged to merge with adjacent holes, and then stripping the lamina from the workpiece to form the structured layer.

Since the substrate wafer in the electrochemical etching is connected as an anode, minority charge carriers move in the n-doped silicon to the first surface residing in contact with the electrolyte and a space charge zone will be formed at this surface. Since the field strength in a region of a depression in the surface is greater than outside this region, the minority charge carriers predominately move toward these points of depressions. A structuring of the surface occurs as a result of this. All the more that the minority carriers move toward an initially small irregularity because of the increased field strength and the etching attack at this location is all the more pronounced the deeper the initially small irregularity becomes due to the etching. The holes grow in the substrate in a crystallographic <100< direction. It is, therefore, advantageous to employ a substrate having this <100> orientation.

The electrochemical etching of n-doped silicon for producing holes or trenches has been disclosed, for example, by EP 0 296 348 A1, wherein trenches are manufactured in this way, particularly for DRAM cells. The employment thereof for stripping laminae from the substrate, however, is not taken into consideration in this reference.

The etching attack is dependent on the current density in the substrate wafer and on the fluoride concentration of the electrolyte. The etching attack is increased by increasing the current density in the electrolyte or by reducing the fluoride concentration in the electrolyte. This fact is utilized in the method of the present invention in order to increase the etching erosion when the depth of the holes that essentially correspond to the thickness of the finished workpiece has been achieved, so that the cross section of a base of each hole can be enlarged. Since, as stated above, the etching attack occurs only in the lower region of the holes, the cross section of the holes will then remain unmodified in the upper region adjacent or in the proximity of the first surface. The holes, however, grow laterally in the lower regions or at the base of the holes. The electrochemical etching is continued until neighboring holes grow together, and the structured layer is thereby stripped as a lamina. The lamina is composed of the interconnected silicon that contains the holes as pores. This lamina can be employed as a perforated workpiece, for example as a mechanical or an optical filter.

Hole diameters in the range of between 20 μm and 50 nm can be easily produced with the method of the present invention.

By, for example, diffusion or implantation, the lamina can be provided with a doping different than the doping of the substrate wafer. In this way, the conductivity of the perforated workpiece can be set.

The surface quality of the perforated workpiece can be influenced by applying an insulating layer to the surface of the lamina. As a result thereof, the workpiece becomes insulating. By producing a thermal silicon oxide or silicon nitride at the surface of the lamina, the surface becomes passivated, resistant to external influences and chemically inert.

The current density in the substrate wafer can be influenced in an especially simple way by illuminated a surface of the substrate wafer lying opposite the first surface. In this case, the stripping of the lamina is achieved by increasing the illumination. In this case, it is also possible to vary the cross section of the holes perpendicular to the first surface on the basis of a variation of the illumination. For example, conical holes can be produced on the basis of a continuous variation of the illumination.

It lies within the framework of the invention to provide the first surface of the substrate wafer with a surface topology before the formation of the holes. In this way, the first surface is designationally provided with depressions at which the etching attack and the electrochemical etching will begin. This will define the arrangement of the holes.

When the first surface is provided with a surface topology composed of regularly-arranged depressions, the lamina exhibits an essentially constant thickness. In this case, namely, the spacing of the holes is essentially the same, so that the amount of material between neighboring holes that must be eroded by increasing the etching attack for stripping the lamina is essentially the same. All holes then essentially simultaneously grow together.

Over and above this, the finished lamina in this case exhibits structural widths, for example widths of the holes or, respectively, of the webs remaining therebetween that are constant within narrow limits. Consistency of the structural width within 10% has been obtained.

When the first surface of the substrate is provided with a surface topology of regularly-arranged depressions before the formation of the holes, minimal structural widths down to 0.1 $\mu$m can be achieved by the method of the present invention. For example, the surface topology is, therefore, produced after producing a photoresist mask on the first surface and subsequent, alkaline etching of the first surface. Conventional optical photolithography is thereby employed for producing the photoresist mask.

It lies within the framework of the invention to produce a surface topology by light-induced electrochemical etching in the same electrolyte, wherein the holes are subsequently etched.

Other advantages and features of the invention will be readily apparent from the following description of the preferred embodiments, the drawings and claims.

BRIEF DESCRIPTION OF THE DRAWINGS

FIG. 1 is a cross sectional view of a portion of a silicon wafer that has been provided with a surface topology;

FIG. 2 is a cross sectional view showing a portion of a surface wafer wherein holes having a constant cross section have been etched by the electrochemical etching process of the present invention;

FIG. 3 is a cross sectional view of a portion of a silicon wafer which has holes etched by the electrochemical etching method of the present invention and which has increased cross sectional areas at the base of the holes, due to changing of the etching parameter;

FIG. 4 is a cross sectional view of a portion of the substrate wafer in which a perforated lamina is being stripped; and FIG. 5 is a top plan view of a perforated lamina that was formed in FIG. 4.

DESCRIPTION OF THE PREFERRED EMBODIMENTS

The principles of the present invention are particularly useful when incorporated in a method for forming a perforated lamina, generally indicated at 6 in FIGS. 4 and 5.

To perform the method of the present invention, a substrate wafer 1 of n-doped, single-crystal silicon having an electrical conductivity of, for example, 5 Ohms cm is provided. The wafer 1 has a first surface 2 which is provided with a surface topology. As illustrated in FIG. 1, the surface topology comprises depression 3 arranged in regular intervals, which may be arranged in rows and columns.

The depressions 3, for example, are produced after producing a photoresist mask with the assistance of a conventional photolithography and subsequent alkaline etching. Alternatively, the surface topology can be formed by light-induced electrochemical etching with an electrolyte and an illumination pattern being produced on the first surface upon employment of a light source having a wavelength less than 1100 nm. The current density in the electrolyte is set so that the anodic minority carrier current locally flows across the substrate wafer only at illuminated locations of the illuminated pattern to create an etching erosion of the first surface at these locations to form the depressions 3.

The first surface 2 of the substrate 1 is brought into contact with a fluoride-containing, acidic electrolyte. The electrolyte has a hydrofluoric acid concentration in a range of 1% to 50%, and preferably at 3%. An oxidation agent, for example hydrogen peroxide, can be added to the electrolyte in order to suppress the development of hydrogen bubbles on the first surface 2 of the substrate 1 during the etching process.

The substrate wafer 1 is connected as an anode. A voltage in a range of 0 volts through 20 volts, and preferably 3 volts, is applied between the substrate wafer 1 and the electrolyte. The substrate wafer 1 is illuminated with a light proceeding from the back side so that a current density of, for example, 10 mA/cm$^2$ is set or obtained. Proceeding from the depressions 3 of FIG. 1, holes 4 will be formed to extend perpendicularly relative to the first surface 2, as illustrated in FIG. 2. These holes 4 are produced by the electrochemical etching. A structured layer 7 is, thus, formed on the first surface.

After approximately 60 minutes of etching time, the anodic current density is increased to, for example, 30 mA/cm$^2$. The voltage between the electrolyte and substrate wafer 1 is, thereby, reduced to 2 volts. The current density continues to be set by illuminating the back side of the substrate wafer 1.

As a result of the modified parameters in the electrochemical etching, the cross section of the base of the holes 4 will be enlarged in the lower region, given continuous etching. Cave-shaped expanded portions 5 are, thus, formed at the base or floor of every hole. The cross section of the cave-shaped expanded portions 5 enlarges until the respective silicon separating neighboring cave-shaped expanded portions are etched away, as illustrated in FIG. 4. This will be the case after approximately 10 minutes, given the recited process parameters.

A lamina 6 that is composed of self-bearing silicon with the holes 4 is, thus, formed. A thickness of 30 $\mu$m for the lamina is achieved with the recited process parameters. This thickness lies far below the thickness of silicon wafers that can be achieved on the basis of conventional sawing.

As illustrated in FIG. 5, the lamina 6 is a self-bearing structured layer 7 that exhibits a uniform distribution of holes 4 that have a round or quadratic cross section. The holes 4 have, for example, a diameter of 2 $\mu$m and are arranged at a spacing of, for example, 1.5 $\mu$m. The holes 4 broaden toward the first surface 2. This is a consequence of the surface topology that was produced at the first surface of the substrate by the depressions 3. These widened portions 8 in the upper region of the holes have the advantage that the lamina 6 can be back-rinsed as a filter. The filter can be cleaned during operation by a brief-duration reversal of the flow direction. In order to vary the electrical conductivity, the lamina 6 can be subsequently provided with doping in a known way. For improving the surface, the lamina can be provided with a thermal silicon oxide or with a thermal silicon nitride. The surface becomes chemically inert as a result of the silicon nitride or silicon oxide layers and the lamina can be utilized as workpieces in corresponding environments.

Since the lamina 6 is composed of silicon, it can be fully annealed or thoroughly baked, or regenerated at a high temperature, if this is required by the respective application.

Although various minor modifications may be suggested by those versed in the art, it should be understood that we wish to embody within the scope of the patent granted hereon all such modifications as reasonably and properly come within the scope of our contribution to the art.

We claim:

1. A method for manufacturing a perforated workpiece having holes extending perpendicular to a first surface of the workpiece, which is of a material of n-doped, single-crystal silicon, said method comprising providing a substrate wafer of an n-doped, single-crystal silicon having the first surface, electrochemically etching the substrate to produce the structured layer by connecting the substrate as an anode, contacting the first surface of the substrate with an electrolyte, setting a current density which will influence the etching erosion, continuing the etching to form the holes extending to a desired depth and corresponding to the thickness of the finished workpiece, and then modifying the parameters of the etching process to cause an increased lateral etching to enlarge the cross section of the holes adjacent the base of the holes with this lateral etching, and subsequently stripping the structured layer of the workpiece as a lamina from the substrate wafer.

2. A method according to claim 1, wherein the electrochemical etching occurs in a fluoride-containing, acidic electrolyte.

3. A method according to claim 1, wherein the substrate wafer is a <100> wafer.

4. A method according to claim 1, wherein the setting of the current density is accomplished by illuminating a second surface of the substrate wafer that lies opposite the first surface.

5. A method according to claim 1, wherein the electrolyte contains hydrofluoric acid in a range of 1% to 50%.

6. A method according to claim 5, wherein the electrolyte additionally contains an oxidation agent.

7. A method according to claim 1, wherein the step of modifying the parameters includes elevating the current density to accomplish stripping of the lamina.

8. A method according to claim 1, wherein the step of modifying the parameters includes reducing the concentration of fluoride in the electrolyte to cause the stripping of the lamina.

9. A method according to claim 1, which includes, prior to etching the substrate, providing the first surface of the substrate wafer with a surface topology which defines the arrangement and location of the holes to be formed during the etching process.

10. A method according to claim 9, wherein the surface topology is composed of regularly-arranged depressions on the first surface.

11. A method according to claim 9, wherein the surface topology is produced by producing a photoresist mask on the first surface and by a subsequent alkaline etching of the first surface.

12. A method according to claim 9, wherein the surface topology is produced by electrochemical etching with an electrolyte and includes an illumination pattern being produced on the first surface upon employment of a light source having a wavelength less than 1100 nm and in that the current density in the electrolyte is set so that the anodic minority carrier current locally flows across the substrate wafer only at illuminated locations of the illuminated pattern to create an etching erosion of the first surface at these locations.

13. A method according to claim 1, which includes doping the lamina to set the conductivity of the workpiece.

14. A method according to claim 1, which includes producing one insulating layer on the surface of the lamina.

15. A method according to claim 1, wherein the perforated workpiece being produced is an optical filter.

16. A method according to claim 1, wherein the perforated workpiece being produced is a mechanical filter.

* * * * *